US010693047B2

(12) United States Patent
Albou et al.

(10) Patent No.: US 10,693,047 B2
(45) Date of Patent: Jun. 23, 2020

(54) LIGHT SOURCE AND CORRESPONDING LUMINOUS MOTOR-VEHICLE MODULE

(71) Applicant: VALEO VISION, Bobigny (FR)

(72) Inventors: Pierre Albou, Bobigny (FR); Christine Roucoules, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 16/315,531

(22) PCT Filed: Jul. 4, 2017

(86) PCT No.: PCT/EP2017/066640
§ 371 (c)(1),
(2) Date: Jan. 4, 2019

(87) PCT Pub. No.: WO2018/007387
PCT Pub. Date: Jan. 11, 2018

(65) Prior Publication Data
US 2019/0237643 A1    Aug. 1, 2019

(30) Foreign Application Priority Data

Jul. 5, 2016   (FR) ...................................... 16 56446

(51) Int. Cl.
*H01L 31/0352* (2006.01)
*H01L 33/58* (2010.01)
(Continued)

(52) U.S. Cl.
CPC ............ *H01L 33/58* (2013.01); *F21S 41/141* (2018.01); *F21S 41/30* (2018.01); *F21S 43/14* (2018.01);
(Continued)

(58) Field of Classification Search
CPC . H01L 31/035227; H01L 33/58; H01L 33/08; H01L 2933/0058; H01L 27/156;
(Continued)

(56) References Cited

U.S. PATENT DOCUMENTS

2006/0097389 A1* 5/2006 Islam .................... B82Y 10/00
257/734
2006/0098308 A1   5/2006 Angelini et al.
(Continued)

FOREIGN PATENT DOCUMENTS

| DE | 10 2007 034 123 A1 | 1/2009 |
| WO | WO 03/048637 A1 | 6/2003 |
| WO | WO 2016/013978 A1 | 1/2016 |

OTHER PUBLICATIONS

International Search Report dated Sep. 15, 2017 in PCT/EP2017/066640 filed on Jul. 4, 2017.

*Primary Examiner* — Andrew J Coughlin
*Assistant Examiner* — Fatima N Farokhrooz
(74) *Attorney, Agent, or Firm* — Oblon, McClelland, Maier & Neustadt, L.L.P.

(57) ABSTRACT

A luminous module includes a light source and an optical part for shaping the light rays emitted by the light source. The light source is a semiconductor source that includes a plurality of electroluminescent units of submillimeter dimensions, and at least one positioning outgrowth configured to participate in the positioning of the light source on an optical part. The light source is positioned with respect to the optical part by interaction of the at least one positioning outgrowth with a corresponding receiving orifice formed in the optical part.

20 Claims, 2 Drawing Sheets

(51) Int. Cl.
*H01L 33/08* (2010.01)
*F21S 41/141* (2018.01)
*F21S 43/27* (2018.01)
*H01L 33/18* (2010.01)
*F21S 43/14* (2018.01)
*F21S 41/30* (2018.01)
*F21V 17/00* (2006.01)

(52) U.S. Cl.
CPC ...... *F21S 43/27* (2018.01); *H01L 31/035227* (2013.01); *H01L 33/08* (2013.01); *H01L 33/18* (2013.01); *F21V 17/005* (2013.01); *H01L 2933/0058* (2013.01)

(58) Field of Classification Search
CPC . H01L 33/20; F21S 43/14; F21S 41/30; F21S 41/141; F21S 43/27; F21V 17/005
See application file for complete search history.

(56) References Cited

U.S. PATENT DOCUMENTS

| | | | |
|---|---|---|---|
| 2007/0003472 A1* | 1/2007 | Tolt | H01J 1/304 423/447.3 |
| 2008/0130137 A1 | 6/2008 | Angelini et al. | |
| 2010/0162728 A1* | 7/2010 | Lee | C23C 28/021 62/3.3 |
| 2010/0283069 A1* | 11/2010 | Rogers | H01L 27/14643 257/98 |
| 2011/0068358 A1 | 3/2011 | Kuo et al. | |
| 2011/0108873 A1* | 5/2011 | Richardson | H01L 33/14 257/98 |
| 2011/0234078 A1 | 9/2011 | Choi et al. | |
| 2012/0068216 A1 | 3/2012 | Kuo et al. | |
| 2012/0275165 A1 | 11/2012 | Choi et al. | |
| 2013/0049041 A1* | 2/2013 | Ramer | H01L 31/024 257/98 |
| 2014/0363912 A1* | 12/2014 | Ohlsson | H01L 33/0062 438/35 |
| 2015/0144873 A1 | 5/2015 | Hwang et al. | |
| 2015/0214261 A1* | 7/2015 | Park | G02B 5/287 257/432 |
| 2016/0093665 A1* | 3/2016 | Schubert | H01L 27/15 257/13 |
| 2016/0306265 A1 | 10/2016 | Riel et al. | |
| 2017/0125518 A1* | 5/2017 | Oxland | H01L 29/0676 |
| 2017/0221963 A1* | 8/2017 | Gardner | H01L 27/156 |
| 2018/0211829 A1* | 7/2018 | Gilet | H01L 21/0254 |
| 2019/0165040 A1* | 5/2019 | Dupont | H01L 33/007 |

* cited by examiner

LIGHT SOURCE AND CORRESPONDING LUMINOUS MOTOR-VEHICLE MODULE

The invention relates to the field of lighting and/or signalling, in particular for motor vehicles. It more particularly relates to luminous modules in which a light source is associated with an optical part for forming and shaping a light beam.

The light sources used in these modules more and more frequently consist of light-emitting diodes, in particular because of the advantageousness thereof in terms of power consumption and bulk with respect to conventional light sources. The use of light-emitting diodes in lighting and/or signalling modules has furthermore allowed players in the market (motor-vehicle manufacturers and designers of lighting and/or signalling devices) to add a creative touch to the design of these devices, in particular through use of an ever higher number of these light-emitting diodes to produce optical effects.

Light-emitting diodes are in particular used in luminous modules that allow adaptive, pixellated beams to be produced, such beams requiring a high precision in order in particular to avoid uncontrolled overlap of the zones of the beam corresponding to two neighbouring diodes. Specifically, there is now a need, in the automotive field, to be able to illuminate the road in front of the motor vehicle in a "partial road lighting mode", i.e. to generate, in a high beam, one or more dark regions corresponding to locations in which oncoming vehicles or vehicles driving in front are located, so as to avoid dazzling other drivers while illuminating the largest possible area of road. Such a function is called an ADB (Adaptive Driving Beam) or even a "selective beam". Such an ADB function consists, on the one hand, in detecting automatically a road user liable to be dazzled by a lighting beam emitted in high-beam mode by a headlamp, and, on the other hand, in modifying the outline of this lighting beam so as to create a dark zone in the location in which the detected user is found.

Conventional light-emitting diodes are fastened to printed circuit boards for controlling the supply of electrical power thereto, and the optical parts are positioned on these printed circuit boards. As a result, positioning the light-emitting means with respect to the optical part involves a several-stage tolerance chain, which generates relative positional tolerances between these components of several hundred microns, which tolerances are disadvantageous or even unacceptable for certain functions and in particular pixellated lighting functions.

This several-stage tolerance chain is in particular due to imprecise positioning of the light source on the printed circuit board, in particular as a result of the light-emitting diode floating on its solder until the latter cools.

In this context, the subject of the invention is a semiconductor light source and a luminous device comprising such a source and an optic for shaping the light rays emitted by this source. In particular, the light source that is one subject of the invention comprises a plurality of electroluminescent units of submillimeter dimensions, and it furthermore comprises at least one positioning outgrowth configured to participate in the positioning of the light source on an optical part.

Thus, the light source is indexed on the optical part, without an intermediary carrier board to which the light source is attached, so as to precisely position the elements with respect to each other and in particular to reliably position the light source with respect to the focal point of the optical part.

The light source comprises a substrate from which said plurality of electroluminescent units of submillimeter dimensions extends, and, according to one feature of the invention, provision is made for the at least one positioning outgrowth to protrude from the same substrate.

The electroluminescent units and the one or more positioning outgrowths may in particular be formed directly on this substrate. Provision may be made for the substrate to be based on silicon or silicon carbide. It will be understood that the substrate is based on silicon provided that it mainly includes silicon, for example at least 50% silicon and in practice about 99% silicon.

According to one feature of the invention, provision may be made for the at least one positioning outgrowth to be higher than the electroluminescent units, this allowing the interaction of the male element formed by this outgrowth and the female element formed in the optical part placed facing the light source to be facilitated.

The term height, whether it be the height of the one or more positioning outgrowths or the height of the electroluminescent units, defines the dimension of extension of these elements from the substrate, substantially perpendicularly to the upper surface thereof, i.e. the surface from which the outgrowths and electroluminescent units emerge.

Thus, a technology that consists in producing the light-emitting zone using a plurality of electroluminescent units that are grown on a substrate is applied to the automotive field, in order to produce a three-dimensional topology that has the advantage of multiplying the light-emission area with respect to the light-emitting diodes that have been known up to now in the automotive field, namely substantially planar diodes, and this three-dimensional topology is used to ensure the light source is positioned optimally with respect to the optical part facing which it is arranged. Thus, it is possible to provide, at a lower cost price, because of the multiplication of the area, a very intense light that is regulation-compliant because of the reliable position of the source.

According to various features of the invention, which may be implemented alone or in combination, provision may be made for:

the at least one positioning outgrowth to be formed by a plurality of electroluminescent units;

the electroluminescent units to be distributed between at least one group of emitting units and one group of units forming the at least one positioning outgrowth, only the at least one group of emitting units being electrically connected in order to participate in the emission of a light beam;

the one or more positioning outgrowths are arranged outside of emission zones formed by a group of electroluminesant units; in particular, a positioning outgrowth is positioned in a corner of the light source and, in the case of a plurality of positioning outgrowths, the positioning outgrowths may be respectively positioned in a corner of the light source that is specific thereto;

the at least one positioning outgrowth to be formed by a wall extending between the electroluminescent units.

In the case where a plurality of positioning outgrowths is provided, whether the latter be formed by electroluminescent units or by walls, it will be understood that the number and location of these outgrowths are defined so as to ensure an isostatic positioning of the shaping optic with respect to the light source and in particular with respect to the substrate.

According to other features, provision will possibly be made for the semiconductor light source comprising a plurality of electroluminescent units of submillimeter dimensions to furthermore include a layer of a polymer material forming an encapsulant that covers the source so as that at least one electroluminescent unit is embedded therein: such an encapsulant is deposited on the substrate so as to cover the units, and it is advantageous for the encapsulant to extend at least as far as to cover the highest unit. The one or more positioning outgrowths extend, according to one feature of the invention, beyond the layer of polymer material forming the encapsulant.

This polymer material may be based on silicone, it being understood that the polymer material is based on silicone provided that it mainly includes silicone, for example at least 50% silicone and in practice about 99% silicone. The layer of polymer material may comprise a luminophore or a plurality of luminophores that are excited by the light generated by at least one of the plurality of electroluminescent units. By luminophore, or light converter, what is meant is that at least one luminescent material is present, said luminescent material being designed to absorb at least some of at least one excitation wavelength emitted by a light source and to convert at least some of said absorbed excitation wavelength into an emission having a different wavelength from that of the excitation wavelength. This luminophore, or this plurality of luminophores, may be at least partially embedded in the polymer or indeed placed on the surface of the layer of polymer material. By way of example, the rays emitted by the electroluminescent units may be of wavelength corresponding to the colour blue and certain of said rays may be liable to be converted into rays of wavelength corresponding to the colour yellow, so that recombination of the non-converted blue and the yellow forms a white beam outside of the layer of polymer material.

The light source may include a plurality of positioning outgrowths, at least two positioning outgrowths being arranged substantially perpendicular to each other; a poka yoke is thus formed, optimizing the placement of the light source with respect to the optical part.

Provision may be made for the electroluminescent units, which may also be considered to be rods that protrude from a carrier, to be selectively activatable, and for at least two groups of light-emitting rods of the light source to be arranged to be selectively turned on, it being understood that by this what is meant is that one or more rods of the light source may be controlled so as to adjust their light intensity. Provision will then be made for a system for controlling individual turn-on of these rods, it being understood that what is mainly meant by this is that the rods may be turned on or turned off separately from one another, whether simultaneously or not.

Production of a pixellated light is thus made possible, which light may be changed depending on the driving conditions by turning off and turning on one or other of the rods forming the light source. In other words, the application of a semiconductor light source, including light-emitting rods of submillimeter dimensions, in a motor-vehicle headlamp allows adaptive lighting systems, with which it may be desired to form pixellated beams a portion of which may be turned off, for example in order not to dazzle another road user, to be implemented more simply. As a result there is a vital need to reliably position the light source and the electroluminescent units with respect to the optical part, in order to achieve a precise segmentation of the beams.

According to a series of features specific to the makeup of the electroluminescent units and to the arrangement of these electroluminescent units on the substrate, provision will possibly be made for, each of the following features possibly being implemented alone or in combination with the others:

each unit to have a general cylindrical shape, in particular a shape of polygonal cross section; provision will possibly be made for each unit to have the same general shape, and in particular a hexagonal shape;

the electroluminescent units to each be bounded by a terminal face and by a circumferential wall that extends along a longitudinal axis of the rod defining its height, the light being emitted at least from the circumferential wall; this light could also be emitted via the terminal face;

each electroluminescent unit to possibly have a terminal face that is substantially perpendicular to the circumferential wall, and in various variants, for provision to possibly be made for this terminal face to be substantially planar or curved, or pointed, at its centre;

the electroluminescent units to be arranged in a two-dimensional matrix array, whether this matrix array be regular, with a constant spacing between two successive electroluminescent units of a given alignment, or the electroluminescent units be arranged staggered;

the height of an electroluminescent unit to be comprised between 1 and 10 microns, whereas the height of a positioning outgrowth is comprised between 5 and 20 microns (to be validated by the inventors);

the largest dimension of the terminal face to be smaller than 2 microns;

the distance that separates two immediately adjacent electroluminescent units to be at least equal to 2 microns, and at most equal to 100 microns.

The invention also relates to a luminous module including a light source such as described above and an optical part for shaping the light rays emitted by the light source, wherein the light source is positioned with respect to the optical part by interaction of the at least one positioning outgrowth with a corresponding orifice formed in the optical part.

By shaping optic what is meant is that at least one of the rays emitted by the light source is deviated by the shaping optic, i.e. that the direction of entrance of this at least one light ray into the shaping optic is different from the direction of exit of the light ray from the shaping optic.

The shaping optic may comprise an optic for projecting the light emitted by the semiconductor light source. This projecting optic creates a real and possibly anamorphic image of one portion of the device, for example the source itself or a shield, or of an intermediate image of the source, at a (finite or infinite) distance that is very large with respect to the dimensions of the device (in a ratio of about at least 30 and preferably of 100).

Provision will possibly be made, according to the invention, for the optical part to be a lens placed on the path of the rays emitted by the light source, so as to form an optic for shaping or projecting these rays, or indeed for it to consist of a reflector.

The optical part will possibly be arranged so that the light source is not located in the object focal plane of the lens.

The optical part may have a receiving orifice that is associated with a positioning outgrowth of the source, the positioning outgrowth having a defined male shape that is able to be accommodated in the cross section of the female shape of the receiving orifice. Provision will possibly be made for the positioning outgrowth to have a circular or polygonal cross section, in particular when it is formed by existing light-emitting elements, or indeed freer cross sections such as cruciform or rectangular cross sections. Furthermore, provision will possibly be made for the cross sections of the male and female elements to not necessarily be complementary and, by way of example, the outgrowths will possibly have a circular cross section whereas the cross section of the orifices is triangular in shape.

In the case where the light source includes a layer of at least partially covering polymer material, the optical part may be pressed against this layer of polymer material.

The invention also relates to a lighting and/or signalling device including a casing for receiving at least one luminous module such as just described, the casing advantageously being closed by a closing outer lens.

The luminous device comprises a light source that generates light rays that form at least one regulatory motor-vehicle light beam. By regulatory beam, what is meant is a beam that complies with one of the photometric charts illustrated in the figures. The device may equally well be placed in a front motor-vehicle headlamp as in a rear motor-vehicle lamp.

A method for mounting a luminous module such as has just been described may in particular include a step of picking up the optical part, which is placed facing a carrier of the light source, a step of positioning the carrier with respect to the optical part by interaction of at least one positioning outgrowth of the light source with a receiving orifice for this outgrowth, which orifice is arranged on the optical part, and a step of fastening the carrier to the optical part by way of tabs that protrude from the optical part in order to be fastened to this carrier.

The carrier may be fastened by staking or by adhesive bonding the fastening tabs of the optical part to the carrier or by screwing.

According to one feature of the invention, at least the positioning step and the step of fastening the carrier to the optical part are carried out under a negative pressure in order to avoid the presence of air between the optical part and the layer of polymer material, in order to remove one dioptric interface on the path of the light rays exiting from the light source in the direction of the optical part.

Other features and advantages of the present invention will become more clearly apparent from the description and drawings, in which.

Figure 4:
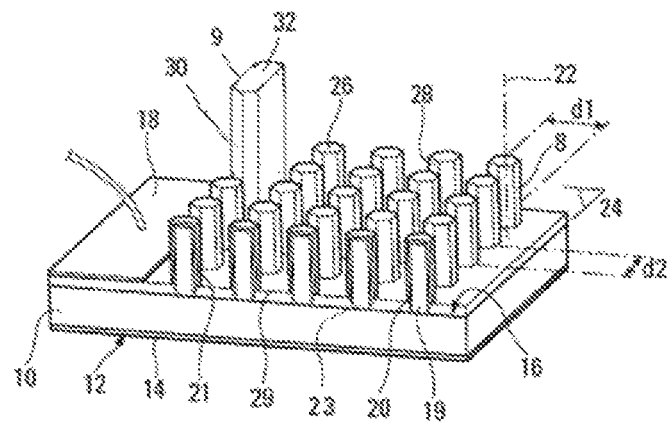
Figure 5:
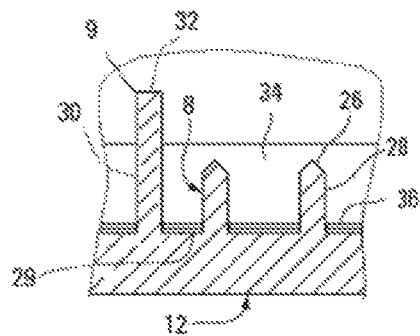

FIG. 4 is a schematic perspective representation of a semiconductor light source according to the invention, in which one row of electroluminescent units has been shown in cross section, and in which an example embodiment of a positioning outgrowth has been shown; and FIG. 5 is a cross-sectional view of a detail of one particular embodiment of a semiconductor light source according to the invention, in which two electroluminescent units and one positioning outgrowth protrude from a substrate, said electroluminescent units being encapsulated in a protective layer whereas the positioning outgrowth extends therebeyond.

A lighting and/or signalling device of a motor-vehicle includes a luminous module 1, in particular housed in a casing 2 closed by an outer lens 3 and that defines an internal volume for receiving this luminous module. The luminous module includes at least one light source 4 associated with an optical part 6 that is arranged in the vicinity of the light source so that at least some of the light rays emitted by the light source make contact with the optical part. Such as may have been specified above, the optical part may consist in a shaping optic or in a projecting optic, changing a direction of at least some of the light rays emitted by the source.

The light source 4 is a semiconductor source, comprising electroluminescent units of submillimeter dimensions, i.e. three-dimensional semiconductor sources such as will be described below, contrary to conventional two-dimensional sources, which may be considered to be substantially planar sources because of their thickness, which is about a few nanometers, whereas a light source made up of electroluminescent units has a height at least equal to one micron.

The light source 4 comprises a plurality of electroluminescent units 8 of submillimeter dimensions, which will be referred to below as light-emitting rods, and at least one positioning outgrowth 9. These light-emitting rods 8 and the one or more positioning outgrowths 9 begin on the same substrate 10, the one or more positioning outgrowths differing from an electroluminescent unit in their height, i.e. the distance at which the free end of these components that protrude from the substrate lies, and/or in their width, i.e. a magnitude in at least one dimension in the plane of the substrate. The one or more positioning outgrowths are thus configured to participate in the positioning of the light source on the optical part, by interaction of the male shape of the positioning outgrowth, which is different from the male shapes of the rods, with the female shape of a corresponding orifice formed in the optical part.

Each light-emitting rod 8 and each positioning outgrowth 9 protrudes perpendicularly, or substantially perpendicularly, from the substrate 10, which here is silicon-based, other materials such as silicon carbide being usable without departing from the context of the invention. By way of example, the light-emitting rods could be made from gallium nitride (GaN), from an alloy of aluminium nitride and gallium nitride (AlGaN), or even from an alloy of aluminium nitride, indium nitride and gallium nitride (AlInGaN).

In FIG. 4, the substrate 10 has a lower face 12, to which a first electrode 14 has been added, and an upper face 16, from which the light-emitting rods 8 and the one or more positioning outgrowths 9 protrude and to which a second electrode 18 has been added. Various layers of materials are superposed on the upper face 16, in particular after growth of the light-emitting rods from the substrate, which growth is here obtained via a bottom-up approach. These various layers may include at least one layer of electrically conductive material, in order to allow electrical power to be supplied to the rods. This layer is etched so as to connect such or such a rod to such or such other rods. These light-emitting rods can then be turned on simultaneously by a control module (not shown here). Provision will then possibly be made for at least two light-emitting rods or at least two groups of light-emitting rods of the semiconductor light source 4 to be arranged so as to be able to be turned on separately, by way of a system for controlling their turn-on.

The light-emitting rods of submillimeter dimensions extend from the substrate and, such as may be seen in FIG. 4, they each include a core 19 made of gallium nitride, around which are placed quantum wells 20 formed by a radial superposition of layers of different materials, here gallium nitride and indium-gallium nitride, and a shell 21 surrounding the quantum wells, which is also made of gallium nitride.

Each rod extends along a longitudinal axis 22 defining its height, the base 23 of each rod being located in a plane 24 of the upper face 16 of the substrate 10.

The light-emitting rods 8 of the semiconductor light source advantageously have the same shape. These rods are each bounded by a terminal face 26 and by a circumferential wall 28 that extends along the longitudinal axis. When the light-emitting rods are doped and biased, the resulting light generated as output from the semiconductor source is emitted essentially from the circumferential wall 28, it being understood that provision may be made for light rays to also exit, at least in a small amount, from the terminal face 26. As a result, each rod acts as a single light-emitting diode and the density of the light-emitting rods 8 improves the luminous efficacy of this semiconductor source.

The circumferential wall 28 of a rod 8, corresponding to the gallium-nitride shell, is covered with a transparent conductive oxide (TCO) layer 29 that forms the anode of each rod, this anode being complementary to the cathode formed by the substrate. This circumferential wall 28 extends along the longitudinal axis 22 from the substrate 10 to the terminal face 26, the distance from the terminal face 26 to the upper face 16 of the substrate, on which growth of the light-emitting rods 8 is initiated, defining the height of each rod. By way of example, provision may be made for the height of a light-emitting rod 8 to be comprised between 1 and 10 microns, whereas provision will be made for the largest transverse dimension of the terminal face, perpendicularly to the longitudinal axis 22 of the light-emitting rod in question, to be smaller than 2 microns. Provision will also possibly be made for the area of a rod, in a cross-sectional plane perpendicular to this longitudinal axis 22, to be comprised in a set range of values, and in particular between 1.96 and 4 square microns.

It will be understood that, during formation of the rods 8, the height may differ from one light source to the next, so as to increase the luminance of the semiconductor light source when the height is increased. The height of the rods may also differ within a single light source, i.e. one group of rods may have a height or heights that are different from that or those of another group of rods, these two groups being constituents of the same semiconductor light source based on light-emitting rods of submillimeter dimensions.

The shape of the light-emitting rods 8 and in particular the cross section of the rods and the shape of the terminal face 26 may also vary from one device to the next. The rods illustrated in FIG. 4 have a generally cylindrical shape, and in particular a cross section of polygonal and more particularly hexagonal shape. It will be understood that it is important for the light be able to be emitted through the circumferential wall, irrespectively of whether, for example, the latter has a polygonal or circular shape.

Moreover, the terminal face 26 may be substantially planar and make a right angle to the circumferential wall, and hence lie substantially parallel to the upper face 16 of the substrate 10, such as is illustrated in FIG. 4, or indeed it may be curved or have a tip at its centre, so as to multiply the directions of emission of the light exiting from this terminal face, such as is illustrated in FIG. 5.

In FIG. 4, the light-emitting rods 8 are arranged in a two-dimensional matrix array, with the rods aligned in rows and in columns that are perpendicular to one another. The light-emitting rods could be arranged staggered. The scope of the invention covers other rod distributions, the density of the rods in particular possibly varying from one light source to the next, and possibly varying between different zones of the same light source. FIG. 4 shows the distance d1 separating two immediately adjacent light-emitting rods in a first transverse direction and the distance d2 separating two immediately adjacent light-emitting rods in a second transverse direction. The separating distances d1 and d2 are measured between two longitudinal axes 22 of adjacent light-emitting rods. The number of light-emitting rods 8 protruding from the substrate 10 may vary from one device to the next, in particular in order to increase the light density of the light source, but it is recommended for one or other of the separating distances d1, d2 to be at least equal to 2 microns, in order for the light emitted by the circumferential wall 28 of each light-emitting rod 8 to be able to exit from the matrix array of rods. Moreover, provision is made for these separating distances to be no larger than 100 microns.

Figure 1:
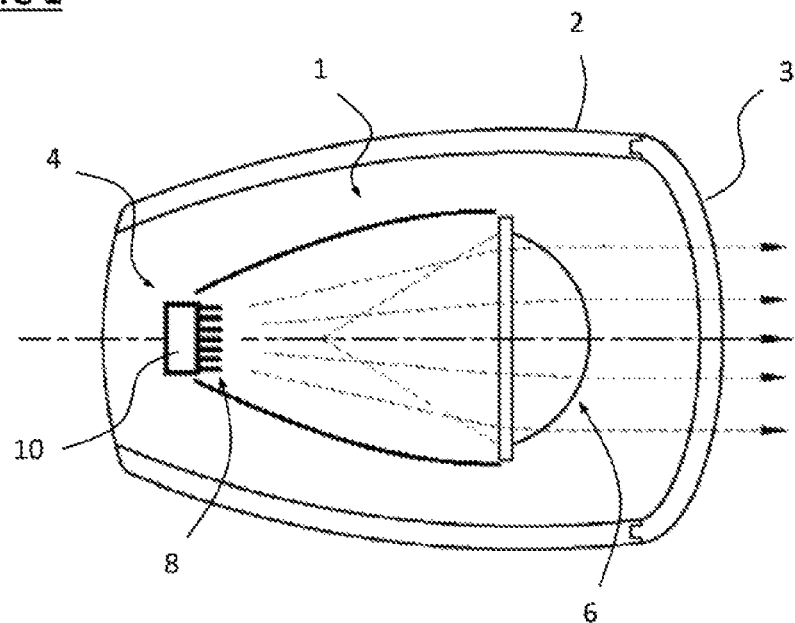
FIG. 1 is a cross-sectional view of a lighting and/or signalling device according to the invention, in which light rays emitted by a semiconductor light source according to the invention in the direction of an optical part have been illustrated.
Figure 2:
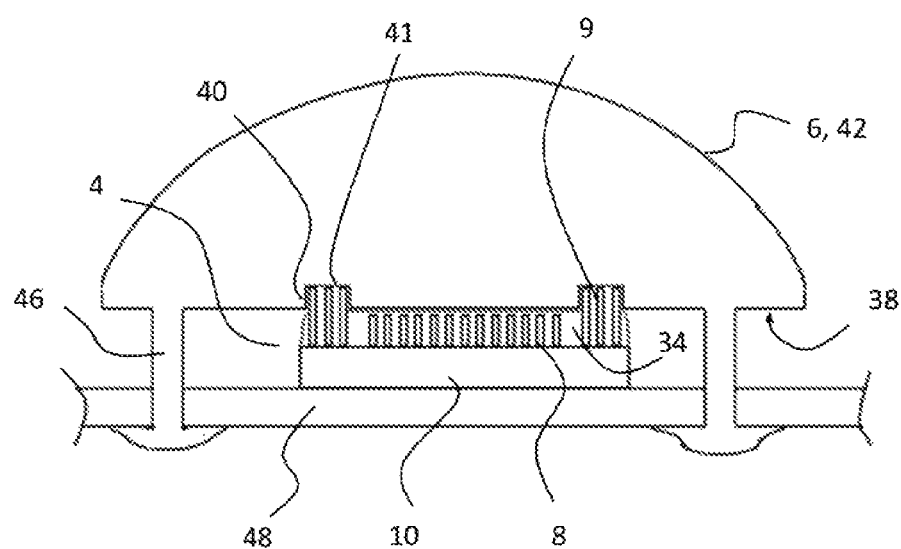
FIG. 2 is a schematic face-on representation of a first embodiment of a luminous module according to the invention, in which a light source is positioned with respect to an optical part formed by a lens, said optical part moreover being fastened to a carrier board of the source.
Figure 3:
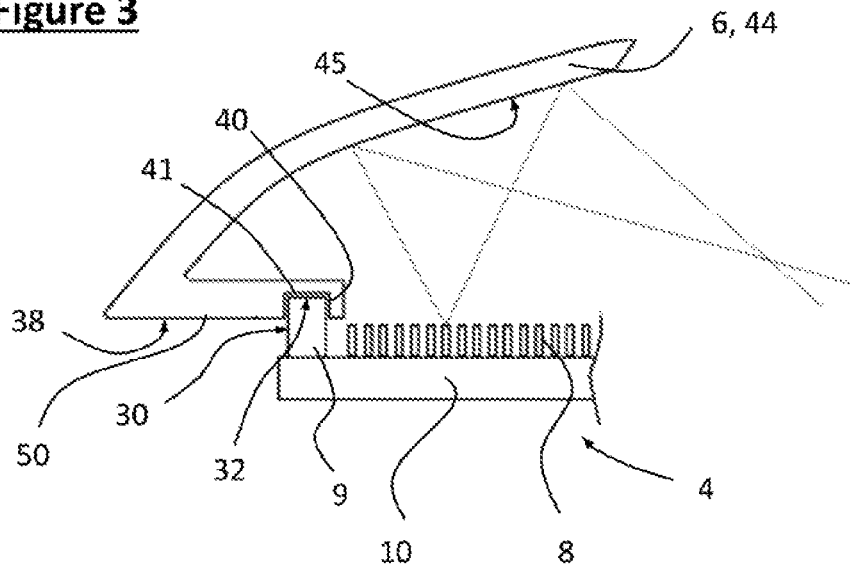
FIG. 3 is a schematic face-on representation of a second embodiment of a luminous module according to the invention, in which a light source is positioned with respect to an optical part formed by a reflector, only the light source and the optical part being shown.

As was specified above, each of the positioning outgrowths 9 differs from the encircling electroluminescent units in its height and/or its width. In FIGS. 2 and 3, positioning outgrowths that are wider and higher than the electroluminescent units 8 have in particular been shown. The positioning outgrowths 9 are thus higher than the electroluminescent units in that they extend a greater distance from the substrate than the electroluminescent units, and they are wider in that they are formed, with respect to the row shown in FIG. 2, by a group of three electroluminescent units. It will be understood that the grouping together of three units to form a positioning outgrowth in this way is described by way of arbitrary example and that this number could be different. Thus provision will possibly be made, by way of example, as illustrated in FIG. 5, for the width of a positioning outgrowth and the width of an electroluminescent unit to be the same.

Each positioning outgrowth 9 may be formed by a plurality of electroluminescent units, which may or may not be electrically connected in order to emit light. It is however advantageous for the electroluminescent units forming a positioning outgrowth not to emit light, so as to prevent light rays from being emitted from a position, with respect to the focal surface of the optical part, that is different from the rest of the electroluminescent units. In this case, it will be noted that the electroluminescent units are distributed between at least one group of emitting units and one group of units forming the at least one positioning outgrowth, only the at least one group of emitting units being electrically connected in order to participate in the emission of a light beam.

As a variant, such as illustrated by way of example in FIGS. 3 and 4, a positioning outgrowth may be formed by a wall that is distinct from the electroluminescent units, and the height and/or width of which makes the shape thereof different from the shape(s) of the electroluminescent units, in order to ensure, as above, that the corresponding orifice formed in the optical part is able to interact only with this positioning outgrowth.

Provision may be made for a plurality of positioning outgrowths 9 to protrude from the substrate 10, and their arrangement thereon may vary from one light source to the next, provided that the position thereof allows an interaction with corresponding orifices in the associated optical part. The role of these positioning outgrowths 9 is to allow the light source 4 to be positioned with respect to the optical part 6 without an intermediary element, and in such a way that it is possible to be certain that the obtained position corresponds to a desired theoretical position, this being achieved by way of the distinctive shape of the positioning outgrowth, i.e. distinctive with respect to the electroluminescent units. In this case of a plurality of positioning outgrowths, provision may also be made for two positioning outgrowths to be oriented substantially perpendicularly. Similarly, two receiving orifices formed in the optical part are oriented substantially perpendicularly, so that the light source can be mounted only in a single direction.

In each of the cases described above, provision may be made for the positioning outgrowths 9 to be arranged outside of emission zones formed by a group of emitting electroluminescent units, in particular in order to not form any opaque zone on the path of the light rays emitted by the emitting units in the direction of the optical part. FIG. 4 in particular illustrates one embodiment in which the positioning outgrowth 9 is placed in a corner of the light source 4 and not encircled by the emitting electroluminescent units 8.

Each positioning outgrowth 9 has a lateral face 30 and, opposite the substrate 10, an upper face 32 forming the free end of the positioning outgrowth.

The lateral face 30 of a positioning outgrowth 9 may allow light rays emitted by the light-emitting rods to be absorbed or reflected directly in the vicinity of this positioning outgrowth. In either case of absorption or reflection, the positioning outgrowths will possibly be formed by a resin or made of metal, and optionally have, on the lateral face, a reflective, or scattering, or absorbent coating.

According to various variant embodiments, the positioning outgrowth 9 may have a cross section of substantially circular or polygonal shape, in particular when it is formed by electroluminescent units, or indeed it may have cruciform or rectangular cross sections.

In each of these cases, the upper face 32 is substantially parallel to the upper face 16 of the substrate 10.

It was possibly described above that the electroluminescent units are obtained by growth from the substrate, and that the one or more positioning outgrowths are obtained in the same way. It may be advantageous to carry out these two operations in succession, in particular in order to grow the positioning outgrowths to a different height from that of the electroluminescent units.

The light source 4 may furthermore include, such as in particular illustrated in FIG. 3, a layer 34 of a polymer material forming an encapsulant in which the light-emitting rods 8 and the positioning outgrowths 9 are at least partially embedded. According to one particular embodiment, illustrated in FIGS. 2 and 5, the layer 34 has a thickness such that the light-emitting rods 8 are embedded in the polymer material whereas the positioning outgrowths 9 are only partially embedded, their free end lying beyond the layer 34. Thus, the polymer material, which may in particular be based on silicone, allows the light-emitting rods 8 to be protected without hindering the transmission of the light rays, and the positioning outgrowths are loose at their end in order to facilitate their function of indexing with the optical part.

Furthermore, it is possible to integrate, into this layer 34 of polymer material, wavelength converting means, and for example luminophores, that are able to absorb at least some of the rays emitted by one of the rods and to convert at least some of said absorbed excitation light into an emission light having a different wavelength from that of the excitation light. Provision will possibly be made either for the wavelength converting means to be embedded in the bulk of the polymer material, or indeed for them to be placed on the surface of the layer of this polymer material.

The light source may furthermore include a coating 36 of material that reflects the light, which coating is placed between the light-emitting rods 8 in order to deviate rays that are initially oriented towards the substrate towards the terminal face 26 of the light-emitting rods 8. In other words, the upper face 16 of the substrate 10 may include a reflecting means that steers light rays that are initially oriented towards the upper face 16 towards the exit face of the light source. Thus rays that would otherwise be lost are collected. This coating 36 is placed between the light-emitting rods 8 on the layer 29 of transparent conductive oxide.

The optical part 6 that forms with the light source a luminous module according to the invention will now be described in more detail.

The optical part 6 has a proximal face 38 placed facing the light source 4, and this proximal face includes at least one orifice 40 for receiving a positioning outgrowth 9. It will be understood that the optical part includes a number of receiving orifices 40 equal to the number of positioning outgrowths 9 so as to cause, during the assembly thereof, one receiving orifice to interact with one positioning outgrowth. The receiving orifices have dimensions that are slightly larger than those of the positioning outgrowths so as to allow the positioning outgrowths to be inserted into these receiving orifices. Provision is made for these receiving orifices to be of a large enough depth to prevent the positioning outgrowth from disengaging from the corresponding receiving orifice before the optical part is fastened to the carrier of the light source.

During the positioning of the light source with respect to the optical part, the positioning outgrowths are placed against the optical part, so that the abutment of the outgrowths in the receiving orifices ensures that the electroluminescent units are correctly positioned with respect to the focal surface of the optical part. To this end, and such as illustrated, the upper face 32 of the positioning outgrowths is brought into abutment against the bottom wall 41 of the corresponding receiving orifice.

The edges bounding the receiving orifices 40 may be configured to define a shape similar to that defined by the corresponding positioning outgrowths, it being understood that though the shapes must be complementary they need not be similar provided that they allow the positioning outgrowth to be housed in the receiving orifice. By way of example, provision will possibly be made for an outgrowth of circular cross section to be accommodated in a receiving orifice the edges of which define a triangular outline.

In so far as a layer 34 of polymer material lies above the electroluminescent units 8 of the light source, provision may be made for the optical part 6 to be pressed against the layer 34 of polymer material. Furthermore, the mounting method is implemented in such a way as to avoid the presence of air in the junction zone between the optical part and the layer of polymer material. It will be noted that, in the case of the presence of a layer of polymer material in which the electroluminescent units are embedded, the positioning outgrowths extend beyond this layer of polymer material so that the polymer material does not interfere in the accommodation of the positioning outgrowth in the corresponding receiving orifice.

The optical part is configured to deviate the rays emitted by the light source placed at the object focal point of the optical part, so as to participate in the formation of a regulatory beam, i.e. a beam that respects the photometric charts of such and such a lighting beam, for example a low beam, a high beam or a daytime running light beam.

The optical part may equally well consist of a lens 42 (in particular shown in FIG. 2) as a reflector 44 (in particular visible in FIG. 3).

In the case illustrated in FIG. 2 of an optical part taking the form of a lens 42, it may be seen that the proximal face 38 in which the receiving orifices 40 are formed is the entrance face of the light rays emitted by the electroluminescent units. These orifices are sufficiently far apart from the entrance zone of the rays that the positioning outgrowths that are accommodated therein do not disturb the path of the rays emitted by the light source into the lens.

The lens 42 moreover includes fastening tabs 46 that extend substantially perpendicularly to the proximal face so as to pass through a carrier board 48 to which the light source 4 is fastened. These fastening tabs are then adhesively bonded to the carrier board or, such as illustrated in FIG. 2, staked to the end face of the carrier board which is opposite the lens.

Such as mentioned above, the optical part may consist of a reflector 44 the reflective face 45 of which is placed facing the light source, this reflector possibly including a rim 50, which is not necessarily reflective, on which the light source is positioned. The proximal face 38 of the optical part, in which the one or more orifices 40 for receiving the one or more positioning outgrowths are formed, in this case consists of the face of the rim that is turned opposite the reflective face. By way of example, light rays emitted by an electroluminescent unit placed at an object focal point of this reflector, so that the rays reflected by the reflector 44 pass through an image focal point, which is advantageously coincident with the object focal point of a lens placed downstream on the path of the rays, have been illustrated.

Once again, provision is made for fastening tabs for holding the optical part in position with respect to a carrier to which the light source is securely fastened.

In each of these cases, the luminous module may be mounted such as has just been described via a step in which the optical part is picked up and placed facing a carrier of the light source. The carrier is then positioned with respect to the optical part by interaction of at least one positioning outgrowth of the light source with an orifice for receiving this outgrowth, which orifice is arranged on the optical part. Correct positioning of the light source with respect to the focal surface of the optical part is thus enabled, while facilitating the step of fastening the carrier to the optical part by way of tabs that protrude from the optical part in order to be fastened to the carrier.

The present invention is applicable both to a front motor-vehicle headlamp and to a rear motor-vehicle light. The above description clearly explains how the invention allows the objectives that were set therefor to be achieved and in particular how the invention allows a light source that participates, in a luminous module and in a lighting and/or signalling device, in the obtainment, by application of one or more positioning outgrowths that extend from a carrier that moreover bears electroluminescent elements, to be provided, and how the invention allows the position of the light-emitting means with respect to the focal surface of the associated optical part to be better managed. It is thus possible to ensure a reliable position of the light source with respect to this focal surface, whether this desired position be centred on the focal surface or offset with respect to the latter. The use of a light source comprising electroluminescent units taking the form of rods, forming a three-dimensional light source, makes it possible to do without a printed circuit board, the electrical cabling being produced directly on the substrate from which the electroluminescent units are grown. The assembly tolerance chain is thus decreased.

The invention claimed is:

1. Semiconductor light source for a luminous motor-vehicle module comprising:
   a semiconductor substrate;
   a plurality of electroluminescent units of submillimeter dimensions formed on the semiconductor substrate, and
   at least one positioning outgrowth grown from the semiconductor substrate and configured to position the light source with respect to the focal point of an optical part, wherein the at least one positioning outgrowth is higher than the electroluminescent units, the at least one positioning outgrowth being not electrically connected and the plurality of electroluminescent units being electrically connected to emit light.

2. The light source according to claim 1, wherein the electroluminescent units and the at least one positioning outgrowth protrude from the same substrate.

3. The light source according to claim 1, wherein the at least one positioning outgrowth is formed by a plurality of electroluminescent units.

4. The light source according to claim 1, wherein the at least one positioning outgrowth is formed by a wall extending from a substrate.

5. The light source according to claim 1, wherein the one or more positioning outgrowths are arranged outside emission zones formed by a group of electroluminescent units.

6. The light source according to claim 1, wherein a layer of polymer material is placed covering the source so that at least one electroluminescent unit is embedded therein.

7. The light source according to claim 1, wherein the light source includes a plurality of positioning outgrowths perpendicular to the substrate and, at least two positioning outgrowths being arranged substantially perpendicular to each other forming a poka yoke.

8. Luminous motor-vehicle module including a light source according to claim 1 and an optical part for shaping the light rays emitted by the light source, wherein the light source is positioned with respect to the optical part by interaction of the at least one positioning outgrowth with a corresponding receiving orifice formed in the optical part.

9. The light source according to claim 2, wherein the at least one positioning outgrowth is formed by a plurality of electroluminescent units.

10. The light source according to claim 2, wherein the one or more positioning outgrowths are arranged outside emission zones formed by a group of electroluminescent units.

11. The light source according to claim 2, wherein a layer of polymer material is placed covering the source so that at least one electroluminescent unit is embedded therein.

12. The light source according to claim 2, wherein the at least one positioning outgrowth includes a lateral face having an absorbent coating configured to absorb light rays emitted by the plurality of the electroluminescent units in a vicinity of the at least one positioning outgrowth.

13. The light source according to claim 2, wherein the at least one positioning outgrowth includes a lateral face having a reflective coating configured to reflect light rays emitted by the plurality of the electroluminescent units in a vicinity of the at least one positioning outgrowth.

14. The light source according to claim 3, wherein the electroluminescent units are distributed between at least one group of emitting units and one group of units forming the at least one positioning outgrowth, only the at least one group of emitting units being electrically connected in order to participate in the emission of a light beam.

15. The light source according to claim 6, wherein said at least one positioning outgrowth extends beyond the layer of polymer material.

16. The luminous module according to claim 8, wherein the optical part has a receiving orifice that is associated with a positioning outgrowth of the source, the positioning outgrowth having a defined male shape that is able to be accommodated in the cross section of the female shape of the receiving orifice.

17. The luminous module according to claim 8, when the light source includes a layer of polymer material wherein the optical part is pressed against the layer of polymer material.

18. Lighting and/or signalling device including a casing for receiving at least one luminous module according to claim 8.

19. Method for mounting a luminous module according to claim 8, wherein:
the optical part is picked up and placed facing a carrier of the light source,
the carrier is positioned with respect to the optical part by interaction of at least one positioning outgrowth of the light source with a receiving orifice of this optical part,
the carrier is fastened to the optical part by way of fastening tabs that protrude from the optical part in order to be fastened to this carrier.

20. Semiconductor light source for a luminous motor-vehicle module comprising:
a semiconductor substrate;
a plurality of electroluminescent units of submillimeter dimensions formed on the semiconductor substrate, and
at least one positioning outgrowth grown from the semiconductor substrate and configured to position the light source with respect to the focal point of an optical part, wherein the at least one positioning outgrowth is higher than the electroluminescent units, the at least one positioning outgrowth being formed by a plurality of electroluminescent units, and the electroluminescent units being distributed between at least one group of emitting units and one group of units forming the at least one positioning outgrowth, only the at least one group of emitting units being electrically connected in order to participate in the emission of a light beam.

* * * * *